United States Patent [19]

Farnworth et al.

[11] Patent Number: 5,304,842
[45] Date of Patent: Apr. 19, 1994

[54] DISSIMILAR ADHESIVE DIE ATTACH FOR SEMICONDUCTOR DEVICES

[75] Inventors: Warren M. Farnworth, Nampa; Rockwell D. Smith; Walter L. Moden, both of Boise, all of Id.

[73] Assignee: Micron Technology, Inc., Boise, Id.

[21] Appl. No.: 904,785

[22] Filed: Jun. 26, 1992

Related U.S. Application Data

[60] Continuation-in-part of Ser. No. 688,023, Apr. 19, 1991, Pat. No. 5,140,404, which is a division of Ser. No. 602,990, Oct. 24, 1990, Pat. No. 5,177,032.

[51] Int. Cl.⁵ ............... H01L 23/48; H01L 29/44; H01L 21/56; H01L 21/58
[52] U.S. Cl. .................. 257/668; 257/666; 257/669; 257/674; 257/676; 257/691; 257/207; 257/208; 257/212; 257/220; 437/915
[58] Field of Search ........... 257/666, 668, 669, 674, 257/676, 691, 735, 736, 787, 788, 798; 437/207, 208, 212, 220, 915, 923

[56] References Cited

U.S. PATENT DOCUMENTS

| | | | |
|---|---|---|---|
| 3,711,625 | 1/1973 | Dupuis | 174/52 |
| 4,012,835 | 3/1977 | Wallick | 29/591 |
| 4,687,693 | 8/1987 | Sheyon et al. | 428/148 |
| 4,761,335 | 8/1988 | Aurichio et al. | 428/352 |
| 4,821,944 | 4/1989 | Tsumura | 228/10 |
| 4,862,245 | 8/1989 | Pashby et al. | 357/70 |
| 4,882,298 | 11/1989 | Moeller et al. | 437/212 |
| 4,916,519 | 4/1990 | Ward | 257/787 |
| 4,924,291 | 5/1990 | Lesk et al. | 357/70 |
| 4,934,820 | 6/1990 | Takahashi et al. | 357/70 |
| 4,937,656 | 6/1990 | Kohara | 357/70 |
| 4,949,160 | 8/1990 | Ohno et al. | 357/70 |
| 5,042,919 | 8/1991 | Yabu et al. | 257/736 |
| 5,062,565 | 11/1991 | Wood et al. | 228/9 |

FOREIGN PATENT DOCUMENTS 59-231825 12/1984 Japan .
2-256251 10/1990 Japan .

*Primary Examiner*—Sara W. Crane
*Assistant Examiner*—Carl Whitehead, Jr.
*Attorney, Agent, or Firm*—Stanley N. Protigal; Kevin D. Martin

[57] ABSTRACT

A semiconductor assembly comprises a semiconductor die which is attached by a carrier material to a lead frame. The carrier material is coated on the die side with one type of adhesive and on the lead frame side with a different adhesive. The lead frame has a small surface area to connect to the carrier material, while the semiconductor die has a large surface area to connect to the carrier material. As used with one inventive embodiment, the adhesive between the die and the carrier softens at a low temperature preventing the die from cracking at elevated temperatures. The adhesive on the lead frame side of the carrier material softens at a higher temperature than the adhesive of the die side of the adhesive, thereby firmly connecting the lead frame having a small surface area to the carrier.

20 Claims, 1 Drawing Sheet

DISSIMILAR ADHESIVE DIE ATTACH FOR SEMICONDUCTOR DEVICES

CROSS REFERENCE TO RELATED APPLICATION

This application is a continuation-in-part of U.S. patent application Ser. No. 688,023, filed Apr. 19, 1991, now U.S. Pat. No. 5,140,404, which was a divisional of U.S. patent application Ser. No. 602,990, filed Oct. 24, 1990, now U.S. Pat. No. 5,177,032.

FIELD OF THE INVENTION

This invention relates to the field of semiconductor manufacture. More specifically, a system for attaching a die to a lead frame is described.

BACKGROUND OF THE INVENTION

Various types of semiconductor devices are manufactured in much the same way. A starting substrate, usually a thin wafer of silicon or gallium arsenide, is masked, etched, and doped through several process steps, the steps depending on the type of devices being manufactured. This process yields a number of die on each wafer produced. The die are separated with a die saw, and then packaged into individual components.

During the plastic packaging process, several semiconductor die are attached to a lead frame, often with a material such as metal, an epoxy, a thermoset, a thermoplastic, or other viscous adhesives. Bond wires couple each of several terminals (bond pads) on each die to conductive leads on the lead frame. The die, the wires, and a portion of the leads are encapsulated in plastic. These leads couple the die with the device into which the component is installed, thereby forming a means of input/output (I/O) between the die and the device.

Bond pads historically have been located around the periphery of the semiconductor die. This allows the lead fingers of the lead frame to be placed very near the edge of the die, and therefore very short bond wires are required to attach the bond pads to the lead fingers. This configuration requires a lead frame paddle, however, to which is attached the semiconductor die, and the use of a die paddle is known to have several problems For example, the metal of the paddle and the material from which the die is manufactured have different coefficients of expansion. If an adhesive is not carefully chosen, the die can be damaged during temperature cycling from stress placed upon it by the expanding and contracting paddle. Also, the lead fingers are typically plated with gold or silver to facilitate bonding with the bond wires, and the paddle is also unnecessarily plated, thereby increasing the cost of production.

One way to solve these as well as other problems associated with the lead frame paddle is described in U.S. Pat. No. 4,862,245 by Pashby, et al. which is incorporated herein by reference. Pashby, et al. describe a die which allows for a "leads over die" configuration, in which the lead fingers of the lead frame are attached to the top of the die, then the bond pads are coupled with the lead fingers by bond wires. A leads over die configuration has the advantage of not requiring a die paddle. It also allows for a smaller package, as well as other advantages described therein.

One step of semiconductor manufacture using the die of Pashby that is not without problems is the die-lead frame attachment. Die-lead frame attachment, as suggested by Pashby, includes an alpha barrier of polymeric film coated on both sides with an adhesive material selected from the group of epoxies, acrylics, silicones and polyimides For the die-alpha barrier attachment, the silicone adhesive is recommended since the silicones minimize corrosion. For the die-lead frame attachment, an epoxy Or acrylic is recommended since these materials assure that the conductors are fully bonded to the alpha barrier, thereby enhancing the thermal conductivity between the semiconductor chip and the conductors, and mechanically locking the lead frame conductors to the semiconductor chip.

A problem which can occur by using any of the referenced materials results from their hard-cure properties. The epoxies and acrylics both harden immediately upon curing to form a somewhat "brittle" attachment. The silicones and polyimides also tend to cure with the repeated application of heat such as that typically found during the formation of a semiconductor device, for example at wire bond, encapsulation, and wave solder, although their attachment is somewhat more pliable than that of the acrylics and epoxies Using any of the materials, once any of the adhesive materials set up it is no longer possible to return them to their precured viscous state.

Once the materials set up, a stress can result between the die and the adhesive material and between the lead frame and the adhesive material resulting from temperature variations and differences in the thermal expansion coefficients between the adhesives and the materials to which they are attached. For example, the metal material of the lead frame expands and contracts at a greater rate than the acrylics and epoxies, and the lead fingers extending over the surface of the die can separate from the adhesive material due to these stresses. Contributing to the separation of the lead fingers from the adhesive is the small size of the lead fingers which results in a small contact area with the adhesive. For this reason, the adhesive which connects the lead fingers to the alpha barrier must be stronger than the adhesive which connects the die to the alpha barrier, as the die to alpha barrier connection has a greater surface area. Damage of the circuitry on the surface of the die can result as the metal circuitry expands and contracts at a greater rate than the adhesive material Thermoset materials have also been used to connect the die to the lead frame. As is known in the art the thermoset materials are viscous at low temperatures and cure with the application of heat. Once the materials cure they are no longer capable of softening. The materials can cure at various temperatures, depending on the material. In any case, with the application of additional heat, the materials further harden. This material can create problems similar to the acrylics and epoxies in that differences in thermal expansion coefficients with the die and lead frame can cause stress on the surface of the die.

Thermoplastics have also been used to couple the die and the lead frame. As is known in the art, these materials are hard at low temperatures, but soften and flow at elevated temperatures. As they cool, they again harden, and again soften with the application of heat. These materials can solve the stress problems associated with the materials described above, as they soften with the application of heat, and therefore the stress is relieved as the die circuitry and lead frame materials expand and the material softens. An identical thermoplastic is conventionally used on both sides of the polyimide carrier material. A problem that can occur when using a thermoplastic to couple the die and the lead frame results from the die contact area being greater than the contact area of the lead frame to the thermoplastic. A thermoplastic which softens at a temperature optimized for the die-alpha barrier attachment can result in separation of the lead frame from the alpha barrier as the softening point is reached, for example during wire bond or at elevated temperatures. Alternately, a thermoplastic optimized for the lead frame-alpha barrier attachment can result in stress on the surface of the die.

An assembly which has reduced susceptibility to separation of the lead frame from the alpha barrier and reduced stress to the surface of the die would be a desirable structure.

SUMMARY OF THE INVENTION

An object of the invention is to provide an assembly which has reduced susceptibility to separation of the lead frame and the die from the alpha barrier.

This object of the invention is accomplished by providing a layer of thermoplastic having a specific softening temperature to connect the die to the alpha barrier, and a second type of material to connect the lead frame to the alpha barrier. The second material can comprise either a second layer of thermoplastic, the second layer of thermoplastic having a higher softening temperature than the first layer, or a layer of thermoset.

The second layer having a different softening temperature than the layer of thermoplastic which connects the die to the alpha barrier is an integral element of the invention. The thermoplastic on the die side of the alpha barrier is selected for its softening temperature. As the assembly approaches a temperature which could damage the die due to stress between the die and the adhesive, the thermoplastic begins to soften before the critical temperature is reached, thereby relieving the stress and preventing die damage. The contact area of the die to the adhesive is large enough that it requires a weak adhesive to maintain adhesion between the die and the alpha barrier, so the die remains in place even though the thermoplastic is softened. If the thermoplastic optimized for the die-alpha barrier is used for the lead frame-alpha barrier attachment, the lead finger will often separate from the alpha barrier resulting from the smaller adhesive-to-lead finger attachment area. The material on the lead frame side of the alpha barrier must therefore soften at a higher temperature than that on the die side since the contact area between a lead finger and the adhesive is small and adhesion is more difficult to sustain.

The invention is described throughout this document in terms of its uses with the die of Pashby. Other embodiments are possible, for instance with a die having bond pads located along an edge or edges of the die (as in a leads under die configuration) or with the bond pads centrally located but rotated 90° from that shown on the Pashby die. These embodiments would be easily manufactured by one skilled in the art from the description herein.

Figure 1:
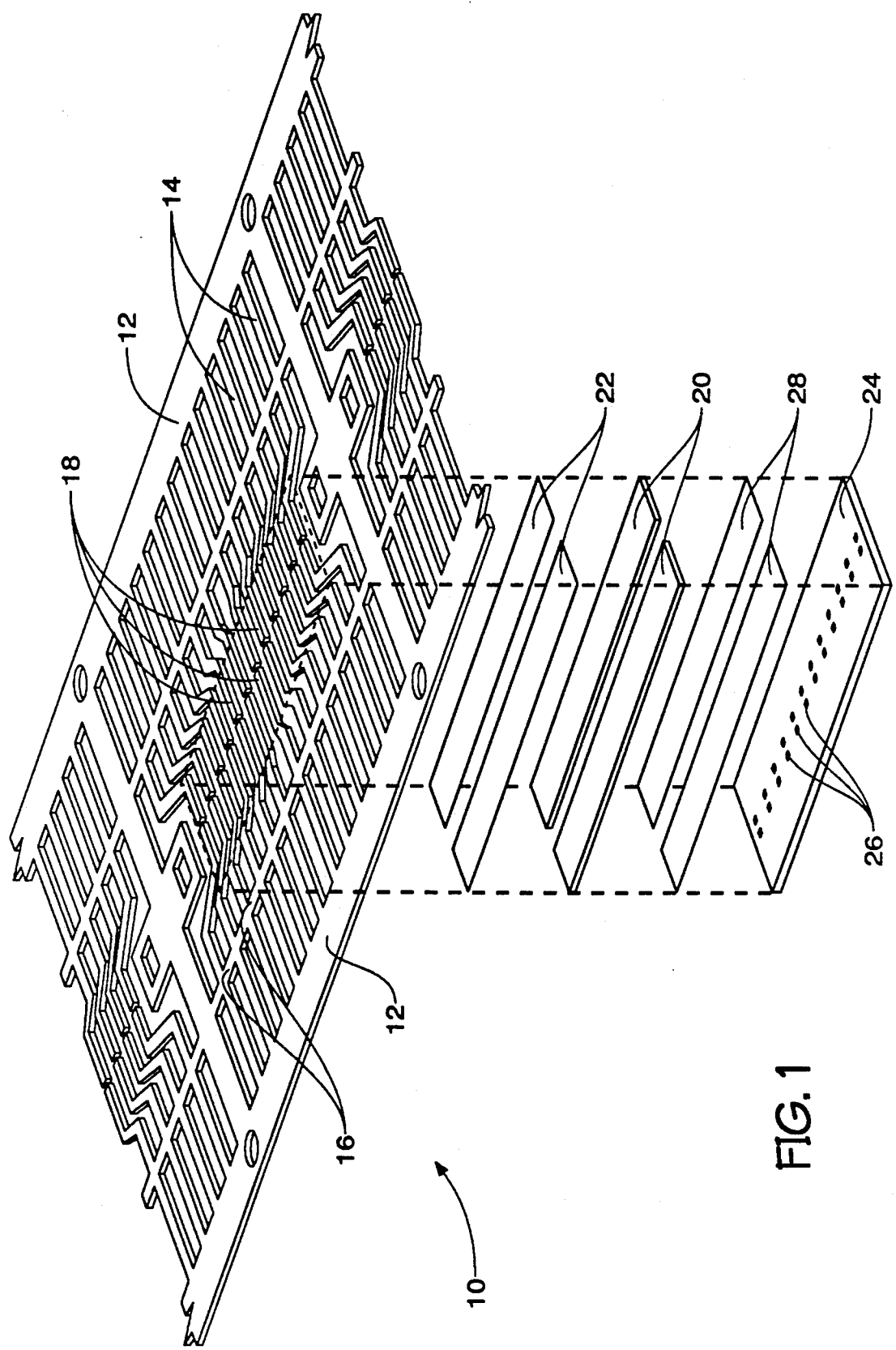
FIG. 1 is an exploded isometric view of a semiconductor assembly having a die with bond pads located along a central axis.

It should be emphasized that the drawing of the instant application is not to scale but is merely a schematic representation and is not intended to portray the specific parameters or the structural details of the invention, which can be determined by one of skill in the art by examination of the information herein.

DETAILED DESCRIPTION OF THE INVENTION

FIG. 1 describes an embodiment of the invention. In this embodiment, a lead frame 10 comprises rails 12, leads 14, tie bars 16, and lead fingers 18. A carrier material 20 such as polyimide is attached on a first side to the lead frame 10 with a first adhesive 22, and a second side of the carrier material 20 is attached to the top surface of the die 24 having bond pads 26 with a second adhesive material 28. A material such as Du Pont's Kapton TM has been used as a carrier material 20, and other materials may also function sufficiently. Note that the adhesive layers 22, 28 are shown in the exploded FIG. 1 as elements separate from the carrier material 20 for clarity, but is typically flowed onto the carrier 20. The carrier material and adhesives are shown in FIG. 1 as being separated into two halves to provide a void therebetween to allow the bond pads to remain uncovered, although elements 20, 22, and 24 are not required to be completely separated.

The second adhesive 28 is such that it softens and flows at a lower temperature than the first adhesive 22, and is therefore a thermoplastic. The thermoplastic 28 is selected for its softening temperature. The temperature at which the thermoplastic 28 softens is selected such that the thermoplastic remains firm at ambient temperatures, but softens at an elevated temperature that would normally cause stress damage to the die 24 if a rigid adhesive was used. For example, if stress damage to a die normally occurs at 150° C. if a rigid adhesive such as an epoxy, acrylic, silicone, or polyimide is used, a thermoplastic which softens at 120° C. might be selected. As the temperature of the assembly reaches 120° C. the thermoplastic softens thereby relieving the stress caused, for example, by the thermal expansion of the die circuitry. The surface area of the die that is connected to the carrier material is fairly large, so the softened adhesive keeps the die attached to the carrier material with minimal separation even though the adhesive has softened.

If the same thermoplastic adhesive was used for the first adhesive, separation of the lead fingers 18 from the carrier material would occur very near 120° C. This separation results from the very small surface area of a lead finger 18 which contacts the adhesive 22. Therefore, the first adhesive material 22 is different from that of the second adhesive 28. The first adhesive 22 can also be a thermoplastic, but one which softens and flows at a higher temperature than the second adhesive. A thermoset or other strong adhesive could also be used. The lead finger is not susceptible to damage from differences in thermal expansion between it and the adhesive, but can separate from the adhesive. This would normally occur at very high temperatures as the lead frame material expands while the adhesive does not. The small surface area of the lead finger connected to the polyimide film by the adhesive may allow the lead finger to pull loose from the adhesive unless a strong adhesive is used. A thermoset would allow for a very strong adhesive bond between the polyimide and the lead fingers of the lead frame, resulting from its continual cure properties with the addition of heat. A high temperature thermoplastic may also have advantages, such as relieving stress between the lead fingers and the adhesive if the assembly temperature is increased passed a certain temperature. For example, if separation of the lead fingers from the adhesive normally occurs at 175° C. due to temperature-induced stress, a thermoplastic which softens at 250° C. may prevent separation until a temperature substantially above 250° C. is reached.

The alpha barrier 20 can comprise any workable material such as polyimide, and any workable thickness. A thickness of under 4 mils provides an adequate alpha barrier, while maintaining a thin package profile after encapsulation of the described assembly The thicknesses of the adhesives applied to the carrier material to form the tape depends on the adhesive used and whether it connects the die or the lead frame to the carrier material Due to the larger surface area, the adhesive on the die side can be somewhat thinner than the adhesive on the lead frame side. A die side adhesive thickness of 0.5 mils is sufficient for most thermoplastics, although a thicker layer could be used. An adhesive thickness of 3 mils may be required on the lead frame side due to the small surface area of the lead fingers.

The inventive arrangement of adhesives has a further advantage as the carrier material is being attached to the die when a thermoset material is used to connect the lead frame with the carrier material. The carrier material typically comes in a roll, and the semiconductor manufacturer cuts the carrier material to fit the die size being assembled. To cut the tape it is interposed between the lead frame and a preshaped punch. A thermode is placed above the lead frame to heat it and the punch contacts the bottom side of the carrier material thereby cutting the tape to the desired shape. The punch lifts the cut tape piece to contact the lead frame, and the heated lead frame softens the adhesive on the tape thereby adhering the tape to the lead frame. Conventionally, a carrier material that uses thermoplastic as an adhesive is coated with the same thermoplastic on either side. The adhesive on the punch side softens along with the adhesive on the die side of the tape due to the transfer of heat through the carrier material As a result, the adhesive can build up over time to contaminate the punch. The adhesive, consequently, must be cleaned off the punch which causes downtime during the production process. The invention, however, allows a thermoset adhesive on the lead frame side of the carrier material to have an initial softening temperature which is lower than the softening temperature of the adhesive on the die side of the carrier material The adhesive on the die side of the tape can be optimized to soften at a temperature above that found at the tape punch step, thereby preventing gumming of the punch and the resulting downtime due to the need for cleaning the punch. Once the thermoset adhesive is softened to connect the lead frame with the carrier material, any additional application of head only further hardens the thermoset. The thermoplastic adhesive on the die side can then be softened to attach the die to the carrier material and the thermoset will firmly hold the lead frame in contact with the carrier material. The thermoset, therefore, has a very high melting temperature after the assembly of the die and lead frame to the carrier material.

Additionally, if a thermoplastic is used on both sides of the carrier material, an adhesive curing step is eliminated as the adhesive hardens as it cools Typically, the assembly must be heated to cure the adhesive (a thermoset) on either side of the carrier material which can further stress the die.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

We claim:

1. A semiconductor assembly, comprising:
   a) a semiconductor die having a major surface with bond pads located thereon;
   b) a lead frame having lead fingers, each lead finger having an end which terminates proximally to said die;
   c) a carrier material having first and second major surfaces;
   d) a first adhesive material which attaches said first major surface of said carrier material with said lead frame;
   e) a second adhesive material which attaches said second major surface of said carrier material with said die,
   wherein after the assembly is assembled said second adhesive softens at a lower temperature than said first adhesive, said softening of said second adhesive relieving stress between said die and said second adhesive, and said first adhesive providing a solid attachment at said second adhesive softening temperature between said lead frame and said carrier material.

2. The semiconductor assembly of claim 1 wherein said second adhesive material is a thermoplastic.

3. The semiconductor assembly of claim 2 wherein said first adhesive material is a thermoplastic.

4. The semiconductor assembly of claim 2 wherein said first adhesive material is a thermoset.

5. The semiconductor assembly of claim 1 wherein said second adhesive material softens below 150° C.

6. The semiconductor assembly of claim 1 further comprising bond wires to electrically couple said bond pads with said lead fingers.

7. The semiconductor assembly of claim 1 wherein said second adhesive contacts said major surface of said die.

8. The semiconductor assembly of claim 1 wherein said first and second adhesives are less than 4 mils thick.

9. The semiconductor assembly of claim 1 wherein said carrier material is less than 5 mils thick.

10. The semiconductor assembly of claim 1 wherein said assembly is encapsulated after said die and said lead frame are attached to said carrier material.

11. An encapsulated semiconductor memory device, comprising:
   a) a semiconductor die having a major surface with bond pads located thereon;
   b) a lead frame having lead fingers, each lead finger having an end which terminates proximally to said die;
   c) a carrier material having first and second major surfaces;
   d) a first adhesive material which attaches said first major surface of said carrier material with said lead frame;

e) a second adhesive material which attaches said second major surface of said carrier material with said die, wherein after the assembly is assembled said second adhesive softens at a lower temperature than said first adhesive, said softening of said second adhesive relieving stress between said die and said second adhesive, and said first adhesive providing a solid attachment at said second adhesive softening temperature between said lead frame and said carrier material.

12. The semiconductor assembly of claim 11 wherein said second adhesive material is a thermoplastic.

13. The semiconductor memory device of claim 12 wherein said first adhesive material is a thermoplastic.

14. The semiconductor memory device of claim 12 wherein said first adhesive material is a thermoset.

15. The semiconductor memory device of claim 11 wherein said second adhesive material softens below 150° C.

16. The semiconductor memory device of claim 11 further comprising bond wires to electrically couple said bond pads with said lead fingers 17. The semiconductor memory device of claim 11 wherein said second adhesive contacts said major surface of said die.

18. The semiconductor memory device of claim 11 wherein said first and second adhesives are less than 4 mils thick.

19. The semiconductor memory device of claim 11 wherein said carrier material is less than 5 mils thick.

20. The semiconductor memory device of claim 10 wherein said memory device is a dynamic random access memory.

* * * * *